(12) United States Patent
Takahashi et al.

(10) Patent No.: US 8,030,223 B2
(45) Date of Patent: Oct. 4, 2011

(54) SOLAR CELL AND METHOD OF FABRICATING THE SAME

(75) Inventors: Masatoshi Takahashi, Tokyo (JP); Hiroyuki Ohtsuka, Tokyo (JP); Hideki Matsumura, Kanazawa (JP); Atsushi Masuda, Tsukuba (JP); Akira Izumi, Kitakyushu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 108 days.

(21) Appl. No.: 12/656,360

(22) Filed: Jan. 27, 2010

(65) Prior Publication Data

US 2010/0173447 A1    Jul. 8, 2010

Related U.S. Application Data

(62) Division of application No. 10/556,063, filed as application No. PCT/JP2004/004405 on Mar. 29, 2004, now abandoned.

(30) Foreign Application Priority Data

May 9, 2003    (JP) ................................ 2003-131797

(51) Int. Cl.
   *H01L 21/318*    (2006.01)
   *H01L 21/471*    (2006.01)
(52) U.S. Cl. ................... 438/791; 438/69; 257/E21.293
(58) Field of Classification Search .................... 438/57, 438/69, 87, 98, 791, 792; 257/E21.293
See application file for complete search history.

(56) References Cited

U.S. PATENT DOCUMENTS

| 6,069,094 A | 5/2000 | Matsumura et al. |
|---|---|---|
| 6,225,241 B1 | 5/2001 | Miyoshi |
| 6,291,366 B1 | 9/2001 | Sano et al. |
| 6,349,669 B1 | 2/2002 | Matsumura et al. |
| 2002/0086557 A1 | 7/2002 | Matsumura et al. |
| 2003/0194881 A1* | 10/2003 | Totsuka et al. ................ 438/791 |
| 2005/0016585 A1 | 1/2005 | Munzer |

FOREIGN PATENT DOCUMENTS

| EP | 0 325 606 B1 | 9/1994 |
|---|---|---|
| JP | A-2-500397 | 2/1990 |
| JP | A-6-188207 | 7/1994 |
| JP | A-6-291114 | 10/1994 |

(Continued)

OTHER PUBLICATIONS

Office Action issued in European Application No. 04724198.9 dated Oct. 15, 2010.

(Continued)

*Primary Examiner* — David Vu
*Assistant Examiner* — Earl Taylor
(74) *Attorney, Agent, or Firm* — Oliff & Berridge, PLC

(57) ABSTRACT

A solar cell (100) comprising a semiconductor solar cell substrate (66) having a light receiving surface formed on the first major surface and generating photovoltaic power based on the light impinging on the light receiving surface, wherein the light receiving surface of the semiconductor solar cell substrate (66) is coated with a light receiving surface side insulating film (61) composed of an inorganic insulating material where the cationic component principally comprising silicon, and the light receiving surface side insulating film (61) is a low hydrogen content inorganic insulating film containing less than 10 atm % of hydrogen. A solar cell having an insulating film exhibiting excellent passivation effect insusceptible to aging can thereby be provided.

14 Claims, 3 Drawing Sheets

FOREIGN PATENT DOCUMENTS

| | | |
|---|---|---|
| JP | A-8-055858 | 2/1996 |
| JP | A-8-250438 | 9/1996 |
| JP | A-9-097916 | 4/1997 |
| JP | A-9-205209 | 8/1997 |
| JP | A-9-244284 | 9/1997 |
| JP | A-10-083988 | 3/1998 |
| JP | A-10-209151 | 8/1998 |
| JP | A-2000-216163 | 8/2000 |
| JP | A-2002-075877 | 3/2002 |
| JP | A-2002-329876 | 11/2002 |
| JP | A-2003-124133 | 4/2003 |
| WO | WO 89/00341 A1 | 1/1989 |

OTHER PUBLICATIONS

Lauinger, et al., "Optimization and characterization of remote plasma-enhanced chemical vapor deposition silicon nitride for the passivation of p-type crystalline silicon surfaces," J. Vac. Sci. Technol. A; 16(2), pp. 530-543, Mar./Apr. 1998.

Holt, J.K. et al., "Hot-Wire Chemical Vapor Deposition of High Hydrogen Content Silicon Nitride for Solar Cell Passivation and Anti-Reflection Coating Applications," *Elsevier Science B.V.*, Apr. 2003, pp. 37-40, vol. 430, No. 1-2.

Moschner, Jens D. et al., "Thermo-Catalytic Deposition of Silicon Nitride—A New Method for Excellent Silicon Surface Passivation," 29th IEEE Photovoltaic Specialists Conference, New Orleans, May 20-24, 2002, pp. 174-177.

Matsumura, H. et al., "CAT-CVD Process and Its Application to Preparation of Si-Based Thin Films," Materials Research Society Symposium Proceedings, San Francisco, Apr. 5-9, 1999, pp. 67-78, vol. 557.

Kudo, A. et al., "Study on Improvement on Uniformity of CAT-CVD SiNx Thin Films" *Technical Report of IEICE*, Apr. 1999, pp. 59-66, ED99-10.

Okada, Shinya et al., "Improved Properties of Silicon Nitride Films Prepared by the Catalytic Chemical Vapor Deposition Method," *Japan Journal Applied Physics*, Nov. 1997, pp. 7035-7040, vol. 36, No. 11.

B. Lenkeit et al., "High Quality Screen-Printed and Fired-Through Silicon Nitride Rear Contacts for Bifacial Silicon Solar Cells," Proceedings of the International Photovoltaic Solar Energy Conference, May 1, 2000, pp. 1332-1335, XP-001138888, London.

Office Action issued in European Patent Application No. 04724198.9 on Feb. 10, 2011.

Communication Regarding Oral Proceedings issued in European Patent Application No. 04724198.9 on Jan. 17, 2011.

Japanese Office Action issued Dec. 8, 2005 in Application No. 2003-131797 with English translation.

* cited by examiner

SOLAR CELL AND METHOD OF FABRICATING THE SAME

This is a Division of U.S. application Ser. No. 10/556,063 filed Mar. 9, 2007, which in turn is a U.S. National Phase of PCT/JP2004/004405, filed Mar. 29, 2004. The disclosures of the prior applications are hereby incorporated by reference herein in their entirety.

BACKGROUND OF THE INVENTION

1. Field of the Invention

This invention relates to a solar cell capable of directly converting light energy to electric energy, and a method of fabricating the same.

2. Description of the Related Art

A solar cell is a semiconductor element capable of converting light energy into electric power, known types of which include p-n junction type, PIN type and Schottky type, among which the p-n junction type is widely used. It is also possible to roughly classify the solar cell into three types, based on materials composing the substrate, such as silicon crystal-base solar cell, amorphous-silicon-base solar cell and compound-semiconductor-base solar cell. The silicon-crystal-base solar cell is further classified into single-crystal-base solar cell and polycrystal-base solar cell. The silicon-crystal-base solar cell is most disseminated, because silicon crystal substrate for producing the solar cell can be fabricated in a relatively easy manner.

Output characteristics of the above-described solar cell can generally be assessed by measuring an output current-voltage curve using a solar simulator. Point Pm on the curve, giving a maximum product Ip·Vp of output current Ip and output voltage Vp is referred to as maximum output Pm, and a value obtained by dividing Pm by the total light energy incident on the solar cell (S×I: S is element area and I is intensity of irradiated light):

$$\eta = \{Pm/(S \times I)\} \times 100 (\%) \quad (1)$$

is defined as conversion efficiency η of the solar cell. For the purpose of raising the conversion efficiency η, it is important to increase short-circuit current Isc (output current value at V=0 on the current-voltage curve) or open-circuit voltage Voc (similarly output voltage value at I=0), and to shape the output current-voltage curve as being square as possible. Degree of squareness of the output current-voltage curve can generally be assessed by a fill factor (curve factor) defined by:

$$FF = Ipm \times Vpm/(Isc \times Voc) \quad (2)$$

where, a value of FF closer to 1 means that the output current-voltage curve becomes more closer to an ideal square, and thereby the conversion efficiency η is raised.

For the purpose of raising the conversion efficiency η, it is important to reduce surface recombination of carriers (electrons and holes). More specifically, in a solar cell using single crystal silicon, polysilicon or the like as a substrate, minority carriers generated by the incident light such as sunray reach the p-n junction plane mainly by diffusion, extracted as majority carriers to the external through electrodes attached on the light receiving surface and back surface, generating electric energy. In this process, some of the carriers which could possibly be extracted as current may be lost through interface states which reside in the substrate surface other than electrode surfaces, and this may lower the conversion efficiency η.

Known high-efficiency solar cells therefore improve the conversion efficiency η by protecting the light receiving surface and the back surface of the semiconductor substrate, excluding contact portions with the electrodes, with an insulating film, so as to suppress recombination of the carriers at the interface between the semiconductor substrate and the individual insulating films (so-called surface passivation effect). Silicon oxide film has long been used as this sort of insulating film, but the refractive index of which is as small as 1.4 or around, and causes a slightly large reflection loss when used on the light-receiving-surface-side. For this reason, in recent years, there has been an increasing trend in using silicon nitride, having a larger refractive index, and being excellent not only in the passivation effect but also in anti-reflection effect. The silicon nitride film has conventionally been formed by the CVD (chemical vapor deposition) process such as thermal CVD, plasma CVD, photo CVD and so forth. Among these, most generally disseminated is plasma CVD.

FIG. 3 schematically shows a batch-type, parallel-plate plasma CVD apparatus, generally called a direct plasma CVD. The apparatus comprises a reaction vessel 1 equipped with an evacuation device 11, substrate holders 81 placing solar cell substrates 20 at predetermined positions in the reaction vessel 1, film forming gas introducing ducts 31, 32 introducing predetermined film-forming gases, which are reactive gases, into the reaction vessel 1, a high-frequency power source 82 generating plasma by energizing the introduced gas, and a resistance-heating heater 90 keeping a deposition atmosphere at a constant temperature. In the process of film deposition using this apparatus, predetermined film-forming gases are introduced into the reaction vessel 1 at predetermined flow rates through the film forming gas introducing ducts 31, 32, and the high-frequency power source 82 is then operated to set a high-frequency electric field. By this operation, a high-frequency discharge occurs between the substrate holders 81, thereby the film-forming gases are excited to produce a plasma, and an insulating film to be obtained is formed on the surface of the substrates 20 making use of reactions proceeded in the plasma. In an exemplary case where a silicon nitride film is formed as the insulating film, silane is introduced through the film forming gas introducing duct 31, and ammonia is introduced through the film forming gas introducing duct 32, as the film-forming gases, the both are mixed and then supplied to the reaction vessel 1, so as to produce the silicon nitride film making use of decomposition reaction and so forth of silane in the plasma.

The plasma CVD is widely applied to processes of fabricating solar cells because it can ensure a relatively high deposition rate even under a substrate temperature of relatively as low as 400° C. The process, however, raises a problem in that high-energy charged particles produced in the plasma are highly causative of damages of the deposited film or the surface of the substrates (so-called plasma damage), so that the obtained silicon nitride film tends to have a large interface state density, and consequently results in only a poor passivation effect. This is also highly affective to various characteristics of the solar cell.

There has, therefore, been proposed a CVD process making use of an ECR (electron cyclotron resonance) plasma as a method suppressed in the plasma damage. FIG. 4 schematically shows an exemplary apparatus used therefor. Unlike the conventional plasma CVD process, this method is characterized in that the surface of the substrate to be treated is placed apart from a plasma region (plasma zone) so as to make use of radical species in a separated manner, allowing this method to be referred to as "remote plasma CVD", hereinafter. More specifically, a predetermined film-forming gas is introduced into a pre-chamber 101 at a predetermined flow rate through a film forming gas introducing duct 31, and microwaves, in place of high-frequency electric field, are applied to the pre-chamber 101 using a microwave generator 102. The microwaves raise the plasma of the film-forming gas, used also as a carrier gas, and generates reactive species. The reactive species flow into the process chamber 1, and causes chemical reactions with the other film-forming gas supplied through the film forming gas introducing duct 32, thereby an insulating film is formed on the surface of the substrate 20. In an exemplary case where a silicon nitride film is formed as the insulating film, ammonia as a film-forming gas, used also as a carrier gas, is introduced through the film forming gas introducing duct 31, and silane is introduced through the introducing duct 32, the both are mixed, so as to produce the silicon nitride film making use of ammonia decomposition reaction and so forth in the plasma. The remote plasma CVD is partially successful in reducing the plasma damage.

Whichever the plasma CVD process may be, there has, however, been only a little difference in that they were highly causative of plasma damage, and made formation of dangling bonds in the film more distinctive, so that it has been necessary to terminate the dangling bonds using a large amount of hydrogen contained in the film in view of improving the passivation effect (it has also been a natural matter of course that any known plasma CVD process was causative of inevitable incorporation of a large amount of hydrogen derived from the source gases). As a consequence, thus-obtained silicon nitride film contains hydrogen atoms to a maximum of 40 at %, and is causative of time-dependent degradation in the passivation effect under sustained irradiation of light, such as sunray, containing a large energy of ultraviolet radiation.

The conventional silicon nitride film formed by the plasma CVD process has also been shifted in the film composition thereof from the stoichiometric composition towards the silicon-excessive side to a considerably large degree, in order to obtain so-called field effect passivation. A large shift in the film composition towards the silicon-excessive side causes effluence of electrons produced by anion deficiency towards the semiconductor substrate so as to produce positive fixed charge on the cation side, and this results in band bending. This induces formation of an inversion layer in which electrons are excessive in the vicinity of the contact interface on the semiconductor substrate side, with which the passivation effect can be enhanced.

This structure, however, suffers from large drawbacks as described below.

(1) When intended for use as a back electrode, an inversion layer 112 formed in the p-type substrate 111 in the vicinity of an electrode 64 as shown in FIG. 5 tends to cause short-circuiting within an electrode surface, and this consequently results in a decrease in the generated current.

(2) The field passivation effect through formation of the inversion layer ascribable to electron effluence becomes distinctive only when the silicon nitride film is applied on the p-type layer side of the substrate. In the solar cell, carriers generated by photo-assisted excitation in p-type region and n-type region of the substrate are minority carriers, and it may be advantageous to use a p-type substrate, in which electrons having a long lifetime serve as the minority carriers, for the essential portion of the substrate contributive to light absorption, but this allows only a limited passivation effect to be exhibited on the light receiving surface side in which an n-type emitter layer is formed. The surface of the emitter layer is too high in the dopant concentration, so that the band bending can hardly occur only with an amount of fixed charge as much as residing in the silicon nitride film, and the field effect passivation is far from being expected. It can therefore be said that suppression of the plasma damage and consequent suppression of the interface states in the emitter layer hold the key for a desirable passivation. However, such desirable passivation cannot be obtained anyhow, because it is difficult to suppress damage by the general plasma CVD.

It is therefore a subject of this invention to provide a solar cell having an insulating film excellent in the passivation effect and less causative of time-dependent degradation of the passivation effect, and a method of fabricating the same.

DISCLOSURE OF THE INVENTION

In order to solve the above-described subject, a solar cell according to the first aspect of this invention is characterized by comprising a semiconductor solar cell substrate having a light receiving surface formed on a first major surface thereof, and generating photovoltaic power based on the light irradiated on the light receiving surface, wherein the light receiving surface of the semiconductor solar cell substrate is covered with a light-receiving-surface-side insulating film provided as an inorganic insulating film composed of an inorganic insulating material having a cationic component thereof principally comprising silicon, and the light-receiving-surface-side insulating film is configured as a low-hydrogen-content inorganic insulating film having a hydrogen content of less than 10 at %. It is to be noted that "a cationic component thereof principally comprising silicon" in this patent specification means that 50% or more (preferably 80% or more) of the cationic component of the inorganic insulating material is silicon. Any cation other than silicon may be contained so far as the effects of this invention described below can be achieved, without excessively impairing the insulating property of the material. For example, it is possible to introduce alkali metal ions having a large ionic radius, such as cesium ions, so as to increase the fixed charge in the film, to thereby allow them to contribute to the field effect passivation.

According to the first aspect of this invention, the light-receiving-surface-side insulating film is configured using a silicon-base insulating film having a large dielectric constant and being capable of providing a desirable passivation effect, and is also configured as a low-hydrogen-content inorganic insulating film, having a hydrogen content of less than 10 at %, so that the durability of the light-receiving-surface-side insulating film against ultraviolet radiation can be improved to a large degree. More specifically, the passivation effect of the insulating film is less likely to cause time-dependent degradation even if the solar cell is used under an environment in which a light having a large energy content of ultraviolet radiation such as a sunray and a fluorescent lamp is irradiated for a long duration of time, and the conversion efficiency η can be maintained at a desirable value for a long period.

The silicon-base insulating film can be formed by the CVD process. A method of fabricating a solar cell according to the first aspect of this invention is such as fabricating a solar cell which comprises a semiconductor solar cell substrate having a light receiving surface formed on a first major surface thereof, and also having a p-n junction generating photovoltaic power based on the light irradiated on the light receiving surface, the light receiving surface of the semiconductor solar cell substrate being covered with a light-receiving-surface-side insulating film composed of an inorganic insulating film having a cationic component thereof principally comprising silicon, wherein the light-receiving-surface-side insulating film is formed as a low-hydrogen-content inorganic insulating film having a hydrogen content of less than 10 at %, by the catalytic CVD process in which a heat catalyst is placed together with the semiconductor solar cell substrate in a reaction vessel; and a film-forming gas, which comprises a silicon source gas and an anion source gas producing an anionic component capable of binding with silicon in an inorganic material to be obtained, at least either one of the silicon source gas and the anion source gas having hydrogen atoms in the molecule thereof, is supplied to the surface of the semiconductor solar cell substrate while making the film-forming gas into contact with the heat catalyst, so as to deposit an inorganic insulating material produced based on chemical reactions of the film-forming gas on the surface of the semiconductor solar cell substrate.

The catalytic CVD process per se has publicly been known in Japanese Laid-Open Patent Publication "Tokkaihei" No. 10-83988, wherein a mechanism of film formation is presumed as follows:

In an exemplary case where a silicon nitride film is fabricated, a mixed gas of silane ($SiH_4$) and ammonia ($NH_3$) is used and introduced as the film-forming gas. The heat catalyst may be any metal (or alloy) having a catalytic activity of a certain level or above, and can be configured typically by tungsten, molybdenum, tantalum, titanium or vanadium. When the introduced silane gas passes over the surface of the heat catalyst heated at a predetermined temperature, a catalytic decomposition reaction of silane which resembles to adsorption dissociation reaction of hydrogen molecule can proceed, and the decomposition active species of $SiH_3^*$ and $H^*$ are produced. Although a detailed mechanism remains still unclear, it is supposed that adsorption of one hydrogen composing silane onto the tungsten surface weakens the bond between the hydrogen and silicon to thereby decompose silane, and the absorption onto the tungsten surface is then released by heat to thereby produce the decomposition active species of $SiH_3^*$ and $H^*$. Also the ammonia gas goes through a similar catalytic reaction, to thereby produce decomposition active species of $NH_2^*$ and $H^*$. These decomposition active species reach the substrate and contribute to deposition of the silicon nitride film. This is expressed by $SiH_4(g) \rightarrow SiH_3^*(g)+H^*(g)$, $NH_3(g) \rightarrow NH_2^*(g)+H^*$, and $aSiH_3^*(g)+bNH_2^*(g) \rightarrow cSiN_x(s)$, where the subscript g means gas state, and the subscript s means solid state. In the film formation by the catalytic CVD process, using no plasma for film formation, there are no more problems, by principle, of causing damage in the substrate surface by high-energy charged particles in the plasma which have been seen in the plasma CVD apparatus, and of causing degradation of insulating film due to inclusion of the charged particles. It is also advantageous that the substrate does not cause temperature rise unlike the case of plasma exposure, and thereby realizes the process at still lower temperatures.

The catalytic CVD process adopted as described in the above makes it possible to deposit an insulating film with a less amount of interfacial defect while keeping composition thereof constant, and further makes it possible to obtain a silicon-base insulating film highly excellent in the passivation effect. The catalytic CVD process is enhanced in the reaction efficiency by virtue of a catalyst, and allows deposition of a high-quality insulating film without excessively diluting the film-forming gas with a carrier gas such as hydrogen. It is also possible to suppress the residual content of hydrogen derived from the film-forming gas. This effect will become particularly distinctive when the composition is selected so as to suppress generation of dangling bonds of silicon atoms, which can readily bind with hydrogen atoms (for an exemplary case of silicon nitride, a composition such as being not so departing in the silicon-excessive side from the stoichiometric ratio). For this reason, the catalytic CVD process can readily produce a silicon-base insulating film having a hydrogen content of less than 10 at %, while still relying upon CVD process. In view of reducing the hydrogen content in the film, it is more effective to adopt a method of supplying the film-forming gas into the reaction vessel without diluting it with hydrogen.

In this invention, the semiconductor solar cell substrate can be configured, similarly to that of other known solar cells, using single-crystal silicon, polysilicon, gallium arsenide, germanium or other composite materials. In view of paying a special attention to balance between the conversion efficiency and the price, it is preferable to use single-crystal silicon as the semiconductor solar cell substrate (the same will apply also to second and third aspects of this invention described later).

In the first aspect of this invention, a second major surface of the semiconductor solar cell substrate may be covered with a back-side insulating film provided as an inorganic insulating film composed of an inorganic insulating material having a cationic component thereof principally comprising silicon, a back electrode may be provided so as to cover the back-side insulating film and so as to contact with the back surface of the semiconductor solar cell substrate through conductive portions penetrating the back-side insulating film, and the back-side insulating film may be configured as a low-hydrogen-content inorganic insulating film having a hydrogen content of less than 10 at %. In a bifacial solar cell having the back electrode not covering the entire surface of the back-side insulating film and allowing also the incident light on the back surface to contribute to power generation, the ultraviolet resistant characteristics and, consequently, time-dependent stability of the passivation effect can be improved by configuring also the back-side insulating film as a low-hydrogen-content insulating film.

The hydrogen content of the low-hydrogen-content inorganic insulating film exceeding 10 at % tends to degrade the passivation effect due to ultraviolet irradiation, and prevents the object of this invention from being attained. On the other hand, the hydrogen content of the low-hydrogen-content inorganic insulating film suppressed beyond 1 at % results in saturation of the ultraviolet radiation resistant characteristics, and may undesirably raise the cost due to complication of the process and so forth. Therefore the hydrogen content of the low-hydrogen-content inorganic insulating film is preferably adjusted within a range from 1 at % to 10 at %, both ends inclusive, and more preferably from 1 at % to 5 at %.

In this invention, the silicon-base inorganic insulating material composing the light-receiving-surface-side insulating film or the back-side insulating film can specifically be composed of any one of silicon nitrides, silicon oxides and silicon oxynitrides. Of these, silicon nitride, excellent in the passivation effect, can effectively be used for this invention. Silicon nitride is also advantageous in having a large refractive index, and therefore can be used also as an anti-reflection film if it is applied to the light-receiving-surface-side insulating film (the same will apply also to the second and third aspects of this invention described later).

In particular, the light-receiving-surface-side insulating film is preferably configured as a low-hydrogen-content inorganic insulating film composed of silicon nitride having a refractive index of 2 to 2.5, both ends inclusive. The refractive index smaller than 2 results in only a non-distinctive, anti-reflection effect, whereas exceeding 2.5 induces optical absorption of the light-receiving-surface-side insulating film in the wavelength range contributive to conversion of the incident light into current, and thereby lowers the conversion efficiency. It is therefore preferable that the light-receivingsurface-side insulating film is adjusted to have a refractive index of 2 to 2.1, both ends inclusive.

The refractive index of the silicon nitride film is closely related to its silicon/nitrogen atomic ratio (Si/N atomic ratio), showing a tendency of increasing the refractive index as the atomic ratio of silicon increases. In pursuit of adjusting the refractive index within a range from 2 to 2.5, the present inventors found through investigations that it was preferable to adjust the Si/N atomic ratio within a range from 0.80 to 1.80. This composition is close to the stoichiometric ratio of silicon nitride (Si/N=0.75), and also raises an advantage in that it is less likely to produce dangling bonds on silicon atoms, unlike the conventional case where the plasma CVD process was adopted. In cooperation with an excellent reaction efficiency of generation of silicon nitride in the catalytic CVD process, this is successful in largely reducing the residual hydrogen content in the film, derived from the film-forming gas (10 at % or less, or 5 at % or less), and in very effectively suppressing time-dependent degradation of the passivation effect under irradiation of ultraviolet radiation.

For the case where the inorganic film to be obtained is the above-described silicon nitride film, it is all enough to supply the film-forming gas into the reaction vessel while adjusting the ratio of mixing of a silicon source gas and a nitrogen source gas as an anion source gas so as to obtain silicon nitride having a Si/N atomic ratio of 0.80 to 1.80, both ends inclusive. In an exemplary case where the silicon source gas is silane (defined as generally referring to silicon hydrides: specifically includes monosilane and disilane) and the nitrogen source is ammonia, the Si/N atomic ratio of the resultant silicon nitride film can be adjusted by ratio of flow rates of silane and ammonia supplied to the reaction vessel. The Si/N atomic ratio of the silicon nitride film is adjustable also by pressure of a mixed gas of the silicon source gas and the nitrogen source gas. More specifically, under a constant ratio of mixing of the silicon source gas and the nitrogen source gas, the Si/N atomic ratio of the silicon nitride film is adjustable towards the nitrogen-rich direction by increasing the gas pressure, and towards the silicon-rich direction by decreasing the gas pressure.

In the first aspect of the solar cell of this invention, the back-side insulating film may be a silicon nitride film formed, so as to adjust the Si/N atomic ratio thereof to 0.80 to 1.80, both ends inclusive, by the catalytic CVD process in which a heat catalyst is placed together with the semiconductor solar cell substrate in a reaction vessel; and a film-forming gas, which is comprised of a silicon source gas and a nitrogen source gas, is supplied to the surface of the semiconductor solar cell substrate while making the film-forming gas into contact with the heat catalyst, so as to deposit silicon nitride produced based on chemical reactions of the film-forming gas on the surface of the semiconductor solar cell substrate.

A second aspect of the solar cell of this invention is characterized in comprising a semiconductor solar cell substrate having a light receiving surface formed on the first major surface thereof, and generating photovoltaic power based on the light irradiated on the light receiving surface, wherein a second major surface of the semiconductor solar cell substrate is covered with a back-side insulating film provided as an inorganic insulating film composed of silicon nitride, and a back electrode is provided so as to cover the back-side insulating film and so as to contact with the back surface of the semiconductor solar cell substrate through conductive portions penetrating the back-side insulating film, and wherein the silicon nitride film composing the back-side insulating film is formed so as to adjust the Si/N atomic ratio thereof to 0.80 to 1.80, both ends inclusive, by the catalytic CVD process in which a heat catalyst is placed together with the semiconductor solar cell substrate in a reaction vessel; and a film-forming gas, which comprises a silicon source gas and a nitrogen source gas, is supplied to the surface of the semiconductor solar cell substrate while making the film-forming gas into contact with the heat catalyst, so as to deposit silicon nitride produced based on chemical reactions of the film-forming gas on the surface of the semiconductor solar cell substrate.

A second aspect of the method of fabricating a solar cell of this invention is characterized by a method of fabricating a solar cell which comprises a solar cell comprising a semiconductor solar cell substrate having a light receiving surface formed on the first major surface thereof, and generating photovoltaic power based on the light irradiated on the light receiving surface, wherein a second major surface of the semiconductor solar cell substrate is covered with a back-side insulating film provided as an inorganic insulating film composed of silicon nitride, and a back electrode is provided so as to cover the back-side insulating film so as to contact with the back surface of the semiconductor solar cell substrate through conductive portions penetrating the back-side insulating film, and wherein the silicon nitride film composing the back-side insulating film is formed by the catalytic CVD process in which a heat catalyst is placed together with the semiconductor solar cell substrate in a reaction vessel; and a film-forming gas, which comprises a silicon source gas and a nitrogen source gas, is supplied to the surface of the semiconductor solar cell substrate while making the film-forming gas into contact with the heat catalyst, so as to deposit silicon nitride produced based on chemical reactions of the film-forming gas on the surface of the semiconductor solar cell substrate, while regulating the ratio of mixing of the silicon source gas and the nitrogen source gas so as to adjust the Si/N atomic ratio to 0.80 to 1.80, both ends inclusive. Silane and ammonia can be used as the silicon source gas and the nitrogen source gas, as described above.

The back-side insulating film formed, by the catalytic CVD process as described in the above, as the silicon nitride film having a Si/N atomic ratio of 0.8 to 1.80 raises additional effects specific to the back-side insulating film, as described below. That is, adoption of the catalytic CVD process makes it possible to form the silicon nitride film, having the Si/N atomic ratio close to the stoichiometric composition as described in the above, as a low-defect film having only a small amount of dangling bonds. The film of this sort, having a composition close to the stoichiometric ratio, has a less amount of fixed charge ascribable to electrons caused by excessive silicon, and is less causative of band bending even if it is bonded to the back surface of the semiconductor solar cell substrate. An inversion layer formed on the substrate side can therefore be thinned, and this makes short-circuiting within the electrode surface of the back electrode, as shown in FIG. 5, very unlikely to occur. The film is less causative of defects like dangling bonds possibly providing sites for surface recombination, and is therefore successful in obtaining a desirable passivation effect. Adjustment of the Si/N atomic ratio of the silicon nitride film within a range from 0.80 to 1.80 also makes it possible to reduce the hydrogen content, so that, similarly to the case of the light-receiving-surface-side insulating film, the ultraviolet resistant characteristics and, consequently, time-dependent stability of the passivation effect of the back-side insulating film can be improved, in a bifacial solar cell having the back electrode not covering the entire surface of the back-side insulating film and allowing also the incident light on the back surface to contribute to power generation.

Because the low-defect, high-quality silicon nitride film having a composition expressed by a Si/N atomic ratio of 0.80 to 1.80, close to the stoichiometric ratio, can be obtained by the catalytic CVD process as described above, a desirable passivation effect can be obtained without relying upon the field-effect passivation effect which is contributed by polarity of the inversion layer, and consequently the silicon nitride film can be used both as an insulating film on the light-receiving surface side and as an insulating film on the back side, unlike the silicon-excessive silicon nitride film, and can exhibit the specific effects for both sides.

Next, in the first and second aspects of the solar cell and the method of fabricating the same according to this invention, the inorganic insulating film can be deposited by the catalytic CVD process on the surface of the semiconductor solar cell substrate after being surface-treated by introducing a surface treatment gas into the reaction vessel, and by supplying the surface treatment gas to the surface of the semiconductor solar cell substrate so as to effect the surface treatment, while making the film-forming gas come into contact with the heat catalyst. The general plasma CVD process results in formation of a trace amount of an oxygen-containing transition layer between the substrate and the insulating film, which is, for example, a silicon oxynitride film for the case of silicon nitride film, causative of formation of interfacial defects, whereas the above-described surface treatment can effectively remove the transition layer, can more effectively suppress the formation of interfacial defects, and can more effectively prevent the conversion efficiency of the solar cell from degrading due to surface recombination. For the case where the semiconductor solar cell substrate is a silicon substrate and the inorganic insulating film is a silicon nitride film, it is appropriate to use, for example, ammonia gas as the surface treatment gas.

In the first and second aspects of the solar cell and the method of fabricating the same according to this invention, the inorganic insulating film may be deposited by the catalytic CVD process on the surface of the semiconductor solar cell substrate, and may be post-treated by introducing a post-treatment gas into the reaction vessel, and by supplying the post-treatment gas to the surface of the inorganic insulating film, while keeping the post-treatment gas in contact with the heat catalyst.

Furthermore, a third aspect of the solar cell according to this invention is characterized in comprising a semiconductor solar cell substrate having a light receiving surface formed on the first major surface thereof, and generating photovoltaic power based on the light irradiated on the light receiving surface, wherein a second major surface of the semiconductor solar cell substrate is covered with a back-side insulating film composed of an inorganic insulating film having a cationic component thereof principally comprising silicon, and a back electrode is provided so as to cover the back-side insulating film and so as to contact with the back surface of the semiconductor solar cell substrate through conductive portions penetrating the back-side insulating film, and wherein the inorganic insulating film is such as being deposited and formed by the catalytic CVD process in which a heat catalyst is placed together with the semiconductor solar cell substrate in a reaction vessel; and a film-forming gas, which comprises a silicon source gas and an anion source gas producing an anionic component capable of binding with silicon in an inorganic material to be obtained, is supplied to the surface of the semiconductor solar cell substrate while making the film-forming gas into contact with the heat catalyst, so as to deposit an inorganic insulating material produced based on chemical reactions of the film-forming gas on the surface of the semiconductor solar cell substrate; and such as being post-treated by introducing a post-treatment gas into the reaction vessel, and by supplying the post-treatment gas to the surface of the inorganic insulating film, while keeping the post-treatment gas in contact with the heat catalyst.

Moreover, a third aspect of the method of fabricating a solar cell according to this invention is characterized by a method of fabricating a solar cell which comprises a semiconductor solar cell substrate having a light receiving surface formed on a first major surface thereof, and generating photovoltaic power based on the light irradiated on the light receiving surface, wherein a second major surface of the semiconductor solar cell substrate is covered with a back-side insulating film composed of an inorganic insulating film having a cationic component thereof principally comprising silicon, and a back electrode is provided so as to cover the back-side insulating film so as to contact with the back surface of the semiconductor solar cell substrate through conductive portions penetrating the back-side insulating film, and wherein the inorganic insulating film is deposited and formed by the catalytic CVD process in which a heat catalyst is placed together with the semiconductor solar cell substrate in a reaction vessel; and a film-forming gas, which comprises a silicon source gas and an anion source gas producing an anionic component capable of binding with silicon in an inorganic material to be obtained, is supplied to the surface of the semiconductor solar cell substrate while making the film-forming gas into contact with the heat catalyst, so as to deposit an inorganic insulating material produced based on chemical reactions of the film-forming gas on the surface of the semiconductor solar cell substrate; and is then post-treated by introducing a post-treatment gas into the reaction vessel, and by supplying the post-treatment gas to the surface of the inorganic insulating film, while keeping the post-treatment gas in contact with the heat catalyst.

The present inventors found that the passivation characteristic of the insulating film can further be improved by surface-treating the inorganic insulating film, after being deposited, by supplying the post-treatment gas to the surface thereof, while allowing the post-treatment gas to cause catalytic decomposition reaction with the aid of the heat catalyst, similarly to as in the above-described surface treatment. It is to be noted that the post-treatment after the film formation, proceeded in a hydrogen atmosphere under heating without using any catalyst, has already been known as hydrogen annealing, whereas the catalyst-assisted method of this invention is far superior thereto in the passivation effect. This is supposedly because decomposition chemical species are intentionally produced by the catalytic reaction in the process chamber, and the decomposition chemical species can diffuse into the insulating film to thereby terminate the dangling bonds. According to this method, it is also allowable to lower the substrate temperature than in the general hydrogen annealing, and this raises another advantage of ensuring a more stable post-treatment as compared with the hydrogen annealing, without impairing contact characteristic between the electrodes and the substrate.

BEST MODES FOR CARRYING OUT THE INVENTION

Figure 1:
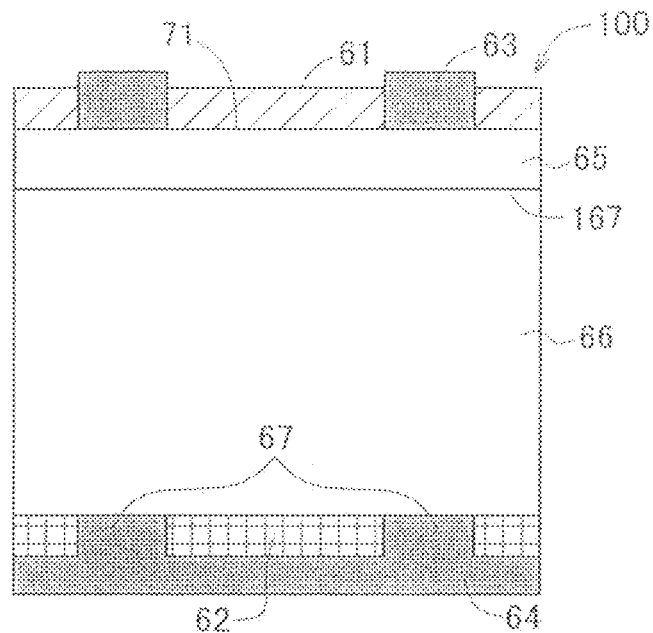
FIG. 1 is a schematic sectional view of the solar cell of this invention.

FIG. 1 is a sectional view schematically showing the best mode for carrying out the solar cell of this invention. The solar cell 100 comprises a first-conductivity-type silicon single crystal substrate 66 (simply referred to as substrate 66 hereinafter; defined as p-type in this embodiment) as the semiconductor solar cell substrate, having on the first major surface of which a second-conductivity-type emitter layer 65 (defined as of n-type in this embodiment) formed thereon, and thereby having a p-n junction plane 167 in the in-plane direction. The emitter layer 65 has, as being formed on the major surface thereof, electrodes 63 for extracting output. Because the emitter layer 65 forms the light-receiving surface of the solar cell, the electrodes can be configured using Al, Ag or the like, as having a wide bus bar electrode reducing the internal resistance, formed at appropriate intervals, and finger electrodes branched from, the bus bar electrode at predetermined intervals in a comb-like form. Non-formation area of the emitter layer 65 having no electrode 63 formed therein is covered with a light-receiving-surface-side insulating film 61 composed of silicon nitride.

On the other hand, a second major surface (back surface) of the substrate 66 is covered with a back-side insulating film 62 composed of silicon nitride, and the entire surface of the back-side insulating film 62 is covered with back electrode 64. The back electrode 64 is brought into electrical contact with the back surface of the substrate 66 through conductive portions (contact holes 67) penetrating the back-side insulating film 62.

The silicon single crystal substrate 66 may be fabricated by either of the FZ (floating zone melting) method and the Czochralski method. It is also allowable to use a GaAs single crystal substrate or a polysilicon substrate in place of the silicon single crystal substrate 66. The silicon single crystal substrate 66 used herein may be a p-type substrate doped with a Group III element such as boron or gallium during the fabrication, or may be an n-type substrate doped with a Group V element such as phosphorus or arsenic, wherein this invention adopts the p-type substrate as described in the above. Resistivity of the substrate is preferably adjusted to 0.1 Ω·cm to 10 Ω·cm, both ends inclusive, and more preferably 0.5 Ω·cm to 2 Ω·cm, both ends inclusive, in view of realizing a high-performance solar cell. The thickness of the substrate of as thick as 50 μm makes it possible to catch the incident light within the solar cell and is advantageous in terms of cost, but it is preferable to adjust it to 150 to 300 μm in view of ensuring a sufficient strength durable in the succeeding processes for the substrate.

The light-receiving-surface-side insulating film 61 is configured as a low-hydrogen-content inorganic insulating film having a hydrogen content of 1 at % to 10 at %, more preferably 1 at % to 5 at %, both ends inclusive. Refractive index of the film is 2 to 2.5, both ends inclusive, allowing the film to be used also as an anti-reflection film. Si/N atomic ratio of the film is adjusted to 0.80 to 1.80, both ends inclusive. On the other hand, the back-side insulating film 62 is also configured as a silicon nitride film having a Si/N atomic ratio of 0.80 to 1.80, both ends inclusive (in this embodiment, the refractive index is 2 to 2.5, and the hydrogen content is 1 at % to 10 at %, more preferably 1 at % to 5 at %, both ends inclusive). Both of these films were formed by the catalytic CVD process in which a heat catalyst was placed together with the semiconductor solar cell substrate in a reaction vessel; and a film-forming gas, which comprised a silicon source gas and a nitrogen source gas, was supplied to the surface of the substrate while making the film-forming gas into contact with the heat catalyst, so as to deposit silicon nitride produced based on chemical reactions of the film-forming gas on the surface of the substrate.

Figure 2:
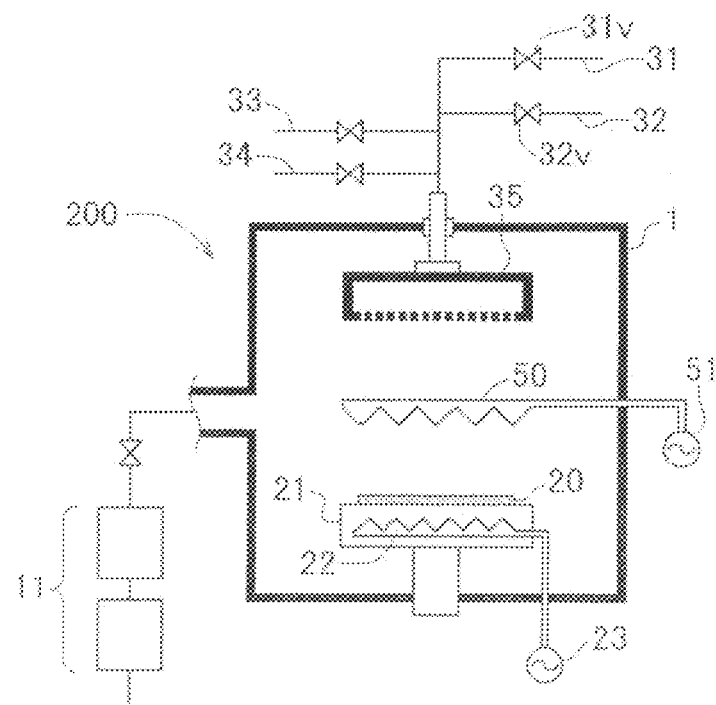
FIG. 2 is a schematic drawing of a film forming apparatus used for a method of fabricating the solar cell of this invention.
Figure 3:
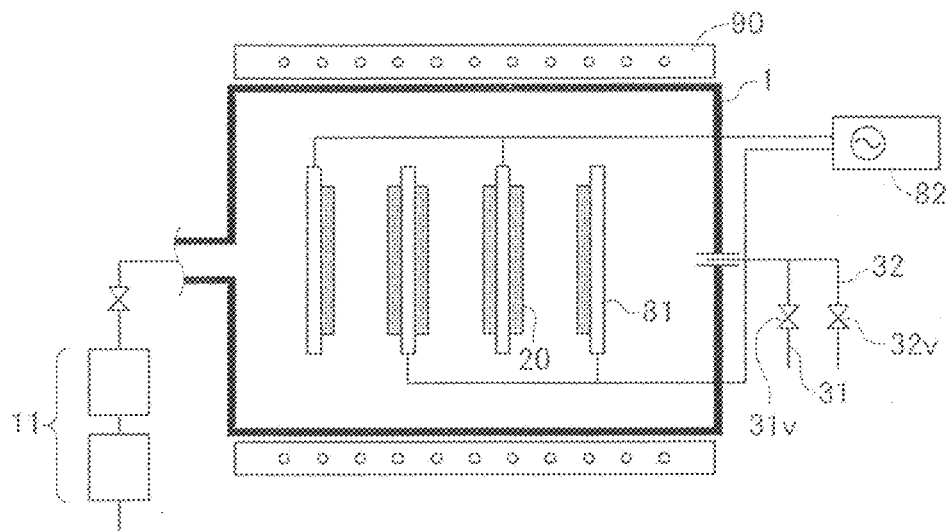
FIG. 3 is a schematic drawing of a batch-type, parallel-plate direct plasma CVD apparatus.
Figure 4:
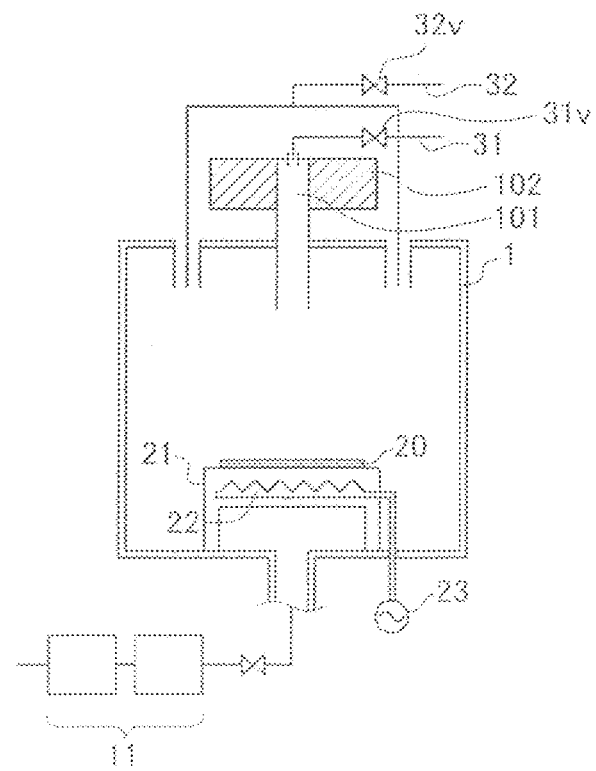
FIG. 4 is a schematic drawing of a single-wafer remote plasma CVD apparatus.

Details of the film formation by the catalytic CVD process are publicly known, for example, by the aforementioned Japanese Laid-Open Patent Publication "Tokkaihei" No. 10-83988 and ditto No. 8-250438, so that only a brief explanation will be given below. FIG. 2 is a schematic drawing of a film forming apparatus applicable to this invention. The film forming apparatus 200 comprises a reaction vessel 1 of which inner space is reduced in the pressure by an evacuation device 11, wherein a substrate 20 is placed on a substrate holder 21 provided in the reaction vessel 1. The substrate 20 on the substrate holder 21 is heated by a substrate heater 22 (built in the substrate holder 21 in this embodiment). The reaction vessel 1 further comprises film forming gas introducing ducts 31, 32 introducing film-forming gases thereinto, a surface treatment gas introducing duct 33 introducing a surface-treatment gas thereinto, heat catalyst 50 provided in the vessel so as to oppose with the substrate 20 on the substrate holder 21, and the heat-catalyst-heating power source 51 heating, under current supply, the heat catalyst 50.

The evacuation device 11 comprises a multi-step vacuum pump comprising a turbo molecular pump, a rotary pump and so forth, and is designed to reduce the pressure in the process chamber to as low as about $10^{-8}$ Torr. The film forming gas introducing ducts 31, 32 are connected to a disk-formed gas introducing head 35 introducing the film forming gas therethrough into the process chamber. The gas introducing head 35 has a hollow body, and has a number of gas blow holes on the front surface, so as to supply the film-forming gas through the gas blow holes down to the major surface (film forming surface) of the substrate 20.

Heat catalyst 50 is disposed on the flow path of the film-forming gas streaming from the gas introducing head 35 towards the substrate 20, and is heated by a heat-catalyst-heating power source 51 to a catalyst activation temperature, to as high as 170° C., for example. The supplied film-forming gas reaches the major surface of the substrate while being made into contact with the heat catalyst 50. The film forming gas under the contact therewith is enhanced to cause reactions such as decomposition so as to produce reaction active species, and allows, an insulating material to deposit on the substrate 20. Heat catalyst 50 in this embodiment is made of a tungsten wire having a diameter of 0.5 mm or around, processed to have a saw tooth form, for example, so as to cover an area wider than the substrate 20. The substrate temperature may be as relatively low as 200° C. to 400° C., which is not causative of degradation in the contact characteristics with respect to the substrate 66, even after the electrodes 63, 64 are formed thereon.

As described in the above, adoption of the catalytic CVD process using the heat catalyst 50 enables film formation without using plasma unlike the conventional process, so that any plasma damages on the surface of the substrate and degradation of the insulating film due to invasion of charged particles are avoidable by principle.

Process steps for the film formation are almost same for both of the light-receiving-surface-side insulating film 61 and the back-side insulating film. Si/N atomic ratio of the silicon nitride film can be adjusted with the above-described range, by monitoring flow rates of silane and ammonia introduced respectively through the film forming gas introducing ducts 31, 32, such as a mass flow controller (not illustrated in the figure), and by controlling ratio of the flow rates using valves 31v, 32v. Silane and ammonia herein are not diluted by hydrogen gas.

Heat catalyst 50 is also used for the surface treatment of the substrate prior to the film formation for the purpose of reducing interfacial defects. For an exemplary case using the substrate 20 composed of silicon single crystal, the surface of the substrate is generally covered with a native oxide film. Even if the native oxide film on the surface of the substrate 20 should preliminarily be removed using hydrofluoric acid or the like, oxidation readily proceeds under normal atmospheres, so that silicon atom species having oxygen atoms bonded thereto remain more or less on the surface of the substrate. For this reason, ammonia gas as the surface treatment gas is introduced, prior to formation of the insulating film, through the surface treatment gas introducing duct 33 via the introducing head 35 into the reaction vessel 1. The ammonia gas is then converted into the active species by the catalytic decomposition reaction with the aid of heat catalyst 50, and oxygen atoms (which possibly serve as sites for surface recombination) of the native oxide film covering the surface of the substrate are substituted by nitrogen atoms which are constituent atoms of the insulating film composed of silicon nitride. The film formation process of the insulating film is subsequently carried out by the catalytic CVD process already explained in the above. This method makes it possible to deposit the insulating film with less amount of interfacial defects while keeping the composition thereof uniform.

The surface treatment gas introducing duct 33 is necessary for the purpose of carrying out the surface treatment, but it is allowable to use the film forming gas introducing duct 31 also as the surface treatment gas introducing duct, for the case where a gas, same as the film-forming gas, is used also as the surface treatment gas, such as the case in which the film-forming gas is a mixed gas of silane (silicon source gas) and ammonia (nitrogen source gas:anion source gas), and the surface treatment gas is ammonia gas. The nitrogen source gas, other than the ammonia gas, applicable to formation of the silicon nitride film may be nitrogen gas or any other nitrogen compound gas. In the configuration of the apparatus shown in FIG. 2, also the surface treatment gas is supplied to the substrate 20 through the gas introduction head 35 similarly to the film-forming gas, allowed to pass in the vicinity of the surface of the heat catalyst 50 so as to cause the catalytic decomposition reaction as described in the above, and thereby to promote the above-described surface treatment reaction for the substrate 20.

Heat catalyst 50 is also used for post-treatment for improving the passivation characteristics of the grown insulating film. More specifically, the characteristics of the insulating film can further be improved by introducing the post-treatment gas such as ammonia gas or hydrogen gas through the post-treatment gas introducing duct 34 after deposition of the insulating film, and by inducing the catalytic decomposition reaction with the aid of the heat catalyst 50, similarly to as in the surface treatment, to thereby effect the post-treatment. Hydrogen annealing, publicly known as the post-treatment, is carried out under a hydrogen atmosphere while heating the substrate at 300 to 500° C., whereas the aforementioned post-treatment is completely different therefrom in that the decomposition chemical species are intentionally generated in the process chamber with the aid of the heat catalyst 50, wherein the passivation characteristics are supposedly improved by decomposition chemical species which diffuse into the insulating film and terminate the dangling bonds. This method also makes it possible to lower the substrate temperature than in the general hydrogen annealing (typically at 200° C. to 400° C., both ends inclusive), so that there is no fear of impairing the contact characteristics between the substrate 66 and the electrodes 63, 64 shown in FIG. 1, even if the insulating film is formed after the electrodes 63, 64. In some cases, the hydrogen content of the film may slightly increase during the post-treatment, but the amount of increase in most cases falls within a range from 1 at % to 3 at %, so that the final hydrogen content of the film never exceeds 10 at % so far as the hydrogen content of the as-deposited film is suppressed to as low as 5 at % or less.

The following paragraphs will describe exemplary process steps of fabricating the solar cell 100 shown in FIG. 1 (although the description herein will be made on the case using a p-type substrate, other situations using an n-type substrate can be understood by reading "$n^+$" as "$p^+$", allowing differences in the physical characteristic values). The method of fabricating the solar cell described hereinafter is only one example, and is never limited thereto. First, the single crystal silicon substrate (FZ process, B-doped) 66 having (100) substrate orientation is subjected to an anisotropic alkali etching called texture etching, to thereby form a pyramid-shaped fine surface texture on the surface thereof. The etching generally adopts a mixture of sodium hydroxide and an alcohol, or an aqueous solution having potassium carbonate or sodium carbonate dissolved therein, producing the surface texture of as large as 1 to 10 μm. The incident light on the light-receiving surface is effectively introduced into the substrate, after being reflected multiple times by virtue of the texture.

An $n^+$ layer, or the emitter layer 65, is then formed. Generally, a Group V element, represented by phosphorus, is doped by a publicly-known method such as thermal diffusion or ion implantation. The surface impurity concentration of the dopant in the $n^+$ layer is preferably adjusted so as to adjust the sheet resistance to 40 to 200Ω/□. The back-side insulating film 62 composed of silicon nitride is then formed on the entire back surface of the substrate by the above-described catalytic CVD process, portions thereof corresponded to the contact holes 67 are then removed by a method such as photolithography, mechanical cutting, laser abrasion or the like, and the back electrode 64 typically composed of Al is deposited by the vacuum evaporation process, sputtering or the like. On the other hand on the light-receiving-surface side of the substrate 66, phosphorus glass and so forth, deposited during diffusion for forming the emitter layer 65, is removed by etching, the surface electrodes 63 are deposited typically by vacuum evaporation through a mask, and thereafter the light-receiving-surface-side insulating film 61 composed of silicon nitride is formed by the similar catalytic CVD process.

In many cases, the passivation characteristics of general semiconductor devices are evaluated by forming a metal/insulator/semiconductor stacked structure (MIS structure) and by measuring the capacitance-voltage (C-V) characteristics. In the solar cell, as discussed based on the extended Schockley-Read-Hall surface recombination model, effective recombination velocity is affected by interface state density, fixed charge in the film, electron- and hole-capture cross sections, substrate impurity concentration, carrier dose and so forth. On the experimental basis, a history of the substrate also affects results of the measurement, because a hysteresis effect may appear in the C-V measurement due to hole trapping by dangling bonds in the silicon nitride film, and the trapped holes may be released by an external factor such as ultraviolet irradiation. It is therefore difficult to understand actual operation state of the solar cell, only based on the interface state density and the in-film fixed charge obtained from the C-V characteristics in the dark state. In the evaluation of the passivation effect for the back surface, it is therefore a general practice to estimate effective surface recombination velocity by simulating the operation state of the solar cell while reproducing carrier injection state under irradiation of a sample to be measured with a bias light, and by measuring the effective life time using a life time scanner. On the other hand, the light-receiving-surface side, that is, the emitter layer 65 side causes lowering in sensitivity, of the C-V measurement or DLTS measurement because of high concentration of a doped impurity, and the depth-wise concentration distribution caused by diffusion makes it difficult to analyze the effective surface recombination velocity. Therefore in many cases, the passivation performance on the light-receiving-surface side is evaluated based on performance of an actually fabricated solar cell.

The conventional plasma CVD process was causative of a heavy plasma damage as described in the above, and it was therefore necessary to intentionally introduce a large amount of hydrogen into the film so as to terminate the dangling bonds. Whereas in this invention, the plasma damage to the substrate is avoidable by forming the light-receiving-surface-side insulating film 61 by the catalytic CVD process, and thereby highly desirable passivation characteristics can be obtained. A less possibility of producing the dangling bonds due to the plasma damage also makes it no more necessary to intentionally introduce hydrogen into the film, and makes it possible to adopt a film composition close to the stoichiometric composition (Si/N atomic ratio=0.75) of silicon nitride, so that the film is far better in the ultraviolet resistance characteristics than the silicon nitride film having a large amount of hydrogen introduced therein by the plasma CVD process.

Figure 5:
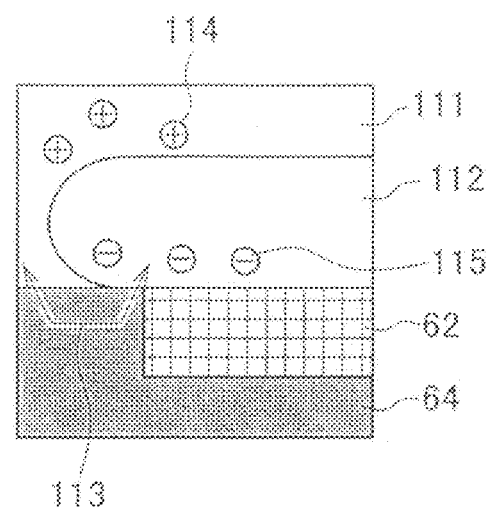
FIG. 5 is a schematic drawing explaining short-circuiting occurring in the vicinity of a back electrode.

No need of largely shifting the composition of the silicon nitride film from the stoichiometric ratio towards the silicon-excessive side raises an effect from another point of view, for the case where the film is adopted to the back-side insulating film 64, of which ultraviolet radiation resistance is of no importance than on the light-receiving-surface side. More specifically, the film composition, not being excessively shifted towards the silicon-excessive side, is successful in suppressing formation of a large inversion layer, as shown in FIG. 5, on the substrate 66 side in the vicinity of contact interface. This effectively prevents in-plane short circuiting via the back electrode 64, and raises the conversion efficiency.

In the film formation by the catalytic CVD process, selection of the temperature of film formation is a critical issue. In an exemplary case where the light-receiving-surface-side insulating layer 61 is formed as an anti-reflection film, the temperature of film formation is preferably set to about 200° C. to 400° C., wherein the temperature as high as possible is preferable in view of the passivation characteristics, because defects in the film to be deposited will further be decreased. It is also preferable to keep the temperature of the substrate 66 below a temperature causative of thermal modification both in terms of material and of structure. In an exemplary case where the electrodes 63 are formed as Al electrodes on the light-receiving-surface-side insulating film 61 in a MIS contact manner, although being brought into contact with the emitter layer 65 in FIG. 1, the temperature of film formation exceeding 400° C. results in spiking of the Al electrodes penetrating the emitter layer, to thereby degrade the performance due to short circuiting. It is therefore preferable to adjust the temperature of film formation to 400° C. or below.

For the case where the above-described surface treatment precedes the film formation, the temperature of the heat catalyst 50 is preferably equal to or lower than the catalyst temperature during the film formation, and is generally adjusted within a range from 1,000 to 1,700° C. Any post-treatment after the film formation is preferably carried out under the temperature of the heat catalyst 50 similar to the conditions of the surface treatment, wherein addition of, or substitution by the general hydrogen annealing is also allowable so far as the contact characteristics of the substrate, or between the electrodes, and the substrate are not impaired.

It is also allowable to form the back-side insulating layer as a general thermal oxide film. In this case, any publicly-known technique such as dry oxidation, wet oxidation, pyrogenic oxidation or the like is applicable. Because the substrate in this process is oxidized on both surfaces thereof, a photo resist is coated on the back surface and dried, the oxide film on the light-receiving-surface-side is removed using a dilute hydrofluoric acid or the like, and the photo resist is then removed. By this process, insulating film 62, on the back surface is formed.

The following paragraphs will describe results of experiments carried out in order to confirm the effects of this invention.

Experiment 1

A 3-inch circular (100) single crystal silicon substrate (FZ method, B doped) having a resistivity of 1.5 Ω·cm was cleaned with 2% hydrofluoric acid for 1 minute, rinsed with ultra-pure water for 5 minutes, and dried by blowing a dry nitrogen. Thereafter a silicon nitride film of 80 nm thick, having a refractive index of 2.4 (Si/N atomic ratio=1.48: without hydrogen dilution), was formed on both surfaces thereof by the catalytic CVD process. Next, an effective lifetime was measured using a lifetime scanner while irradiating a white bias light of 0.5 sun, and the surface recombination velocity was calculated on the basis of a result of lifetime measurement of the same substrate but subjected to chemical passivation (iodine/ethanol treatment). On the other hand, using a 400-W metal halogen lamp as a light source, one surface of the sample was exposed to ultraviolet radiation, from which wavelength component of 320 nm or shorter is cut by a filter, for 32 hours and 128 hours, and the surface recombination velocity was similarly calculated. Hydrogen content of the silicon nitride film was analyzed by the FT-IR method.

Experiment 2

The silicon substrate was cleaned and dried according to the procedures similar to as described in Experiment 1, and by the catalytic CVD process, the substrate was surface-treated using ammonia gas, on both surfaces of which the silicon nitride film having a refractive index of 2.4 was deposited, and then a similar measurement was carried out.

Experiment 3

The silicon substrate was cleaned and dried according to the procedures similar to as described in Experiment 1, and by the catalytic CVD process, the substrate was surface-treated using ammonia gas, on both surfaces of which the silicon nitride film having a refractive index of 2.4 was deposited, post-treated using hydrogen gas, and then a similar measurement was carried out.

Comparative Example 1

The silicon substrate was cleaned and dried according to the procedures similar to as described in Experiment 1, and on both surfaces of which the silicon nitride film having a refractive index of 2.4 was deposited by the direct plasma CVD process (frequency 100 kHz:without hydrogen dilution), and then the similar measurement was carried out.

Comparative Example 2

The silicon substrate was cleaned and dried according to the procedures similar to as described in Experiment 1, and on both surfaces of which the silicon nitride film having a refractive index of 2.4 was deposited by the remote plasma CVD process (microwave 2.5 GHz:without hydrogen dilution), and then the similar measurement was carried out.

Results are shown in Table 1.

TABLE 1

| | Effective surface recombination velocity (cm/s) | | | Rate of change |
|---|---|---|---|---|
| | Before ultraviolet irradiation | 32 hours after | 128 hours after | 128 hours after/before irradiation |
| Experiment 1 | 20 | 30 | 58 | 2.9 |
| Experiment 2 | 18 | 25 | 45 | 2.5 |
| Experiment 3 | 17 | 28 | 40 | 2.4 |
| Comparative Example 1 | 96 | 185 | 542 | 5.6 |
| Comparative Example 2 | 21 | 45 | 108 | 5.1 |

It is found from the results that all samples of Examples 1 to 3, having the silicon nitride films thereof formed by the catalytic CVD process, showed hydrogen contents of the film of as small as 5 at % or less, and showed only small amounts of increase in the effective surface recombination velocity even under sustained ultraviolet irradiation. In other words, they are found to be excellent in the ultraviolet radiation resistant characteristics. Whereas, each of the samples of the Comparative Examples 1 and 2 making use of the plasma CVD process showed an extremely high hydrogen content of the film and a sharp increase in the effective surface recombination velocity under sustained ultraviolet radiation, proving inferiority to the results of Experiments 1 to 3.

Experiment 4

A quasi-square (100) single crystal silicon substrate (FZ process, B-doped) having a resistivity of 0.5 Ω·cm, a thickness of 300 μm and a planar size of 100 mm×100 mm was etched in a concentrated aqueous sodium hydroxide solution to remove damages, and on the entire surface of which a texture was formed in a mixed solution of aqueous sodium hydroxide solution/isopropanol. The substrate was subjected to the RCA cleaning, oxidized at a high temperature (1,000° C.), protected on one surface of which with a photo resist, and only one surface of the oxide film was etched in a buffered hydrofluoric acid solution. After the photo resist was removed, phosphorus was diffused at 830° C. using phosphorus oxychloride as a source so as to adjust sheet resistance of the surface to 100Ω/□. A phosphorus glass formed on the surface was then removed using a 2% hydrofluoric acid, and light-receiving-surface side electrodes (Ti/Pd/Ag) were formed by vacuum evaporation through a mask. The back surface was subjected to machining to form trenches, and thereon the back electrode (Al) was vacuum-deposited. Thereafter, a silicon nitride film having a refractive index of 2.1 (Si/N atomic ratio=1.04:without hydrogen dilution) and a thickness of 80 nm was deposited on the light-receiving-surface side by the catalytic CVD process. Characteristics of thus-obtained solar cell were measured using a solar simulator (1.5 sun).

Experiment 5

Process steps up to the formation of the back electrode were carried out similarly to as described in Experiment 4, the light-receiving surface side was surface treated using ammonia gas by the catalytic CVD process, a silicon nitride film having a refractive index of 2.1 was deposited thereon, and a similar measurement was carried out.

Experiment 6

Process steps up to the formation of the back electrode were carried out similarly to as described in Experiment 4, the light-receiving surface side was surface treated using ammonia gas by the catalytic CVD process, a silicon nitride film having a refractive index of 2.1 was deposited thereon, post-treated using hydrogen gas, and a similar measurement was carried out.

Comparative Example 3

Process steps up to the formation of the back electrode were carried out similarly to as described in Experiment 4, a silicon nitride film having a refractive index of 2.1 was deposited on the light-receiving surface side by the direct plasma CVD process (frequency 100 kHz), and a similar measurement was carried out.

Comparative Example 4

Process steps up to the formation of the back electrode were carried out similarly to as described in Experiment 4, a silicon nitride film having a refractive index of 2.1 was deposited on the light-receiving surface side by the remote plasma CVD process (microwave 2.5 GHz), and a similar measurement was carried out.

Results are shown in Table 2.

TABLE 2

| | Fill factor (%) | Conversion efficiency (%) | Voc (mV) | Jsc (mA/cm$^2$) |
|---|---|---|---|---|
| Experiment 4 | 80.0 | 19.5 | 650 | 37.5 |
| Experiment 5 | 79.8 | 19.5 | 653 | 37.4 |
| Experiment 6 | 80.5 | 19.9 | 655 | 37.8 |
| Comparative Example 3 | 78.4 | 17.8 | 630 | 36.0 |
| Comparative Example 4 | 79.0 | 18.8 | 642 | 37.0 |

From the results, all samples of Examples 4 to 6, having the silicon nitride films thereof formed by the catalytic CVD process, are found to be superior to results of the samples of Comparative Examples 3 and 4 making use of the plasma CVD process, in every aspect of the solar cell characteristics including conversion efficiency. It is also understood that, as shown by Experiments 5 and 6, the differences are more distinctive by carrying out the surface treatment of the substrate before the film formation and the post-treatment using the same catalyst.

Experiment 7

A quasi-square (100) single crystal silicon substrate (FZ process, B-doped) having a resistivity of 0.5 Ω·cm, a thickness of 300 μm and a planar size of 100 mm×100 mm was etched in a concentrated aqueous sodium hydroxide solution to remove damages, and on the entire surface of which a texture was formed in a mixed solution of aqueous sodium hydroxide solution/isopropanol. Two substrates were held back to back, and phosphorus was diffused at 830° C. using phosphorus oxychloride as a source so as to adjust sheet resistance of the surface to 100Ω/□. A phosphorus glass formed on the surface was then removed using a 2% hydrofluoric acid, and light-receiving-surface side electrodes (Ti/Pd/Ag) were formed by vacuum evaporation through a mask. The back surface was surface-treated using ammonia gas by the catalytic CVD process, a silicon nitride film having a refractive index of 2.0 (Si/N atomic ratio=0.91:without hydrogen dilution) and a thickness of 80 nm was deposited thereon by the catalytic CVD process, and then subjected to machining to form trenches, and the back electrode (Al) was vacuum-deposited thereon. Thereafter, a silicon nitride film having a refractive index of 2.1 (Si/N atomic ratio=1.04: without hydrogen dilution) and a thickness of 80 nm was deposited on the light-receiving-surface side by the catalytic CVD process. Characteristics of thus-obtained solar cell were measured using a solar simulator (1.5 sun).

Experiment 8

The solar cell was fabricated, and the characteristics thereof were evaluated by the measurement using a solar simulator (1.5 sun), similarly to as described in Example 7, except that the back surface was surface-treated using ammonia gas by the catalytic CVD process, a silicon nitride film having a refractive index of 2.0 and a thickness of 80 nm was deposited thereon, and the post-treatment was carried out using hydrogen gas.

Comparative Example 5

Process steps up to the formation of the surface electrodes were carried out similarly to as described in Experiment 7, and a solar cell was fabricated and measured by the similar process steps except that a silicon nitride film having a refractive index of 2.0 was deposited on the back surface, and a silicon nitride film having a refractive index of 2.1 was deposited on the light-receiving surface side by the direct plasma CVD process (frequency 100 kHz).

Comparative Example 6

Process steps up to the formation of the surface electrodes were carried out similarly to as described in Experiment 7, and a solar cell was fabricated and measured by the similar process steps except that a silicon nitride film having a refractive index of 2.0 was deposited on the back surface, and a silicon nitride film having a refractive index of 2.1 was deposited on the light-receiving-surface side by the remote plasma CVD process (microwave 2.5 GHz).

Results are shown in Table 3.

TABLE 3

| | Fill factor (%) | Conversion efficiency (%) | Voc (mV) | Jsc (mA/cm$^2$) |
|---|---|---|---|---|
| Experiment 7 | 79.5 | 18.5 | 645 | 36.2 |
| Experiment 8 | 79.6 | 18.8 | 649 | 36.3 |
| Comparative Example 5 | 77.3 | 16.1 | 628 | 33.1 |
| Comparative Example 6 | 78.0 | 17.2 | 635 | 34.7 |

From the results, both samples of Examples 7 and 8, having the silicon nitride films thereof formed by the catalytic CVD process, are found to be superior to results of the samples of Comparative Examples 5 and 6 making use of the plasma CVD process, in every aspect of the solar cell characteristics including conversion efficiency. It is also understood that, as shown by Experiments 5 and 6, the differences are more distinctive by carrying out the surface treatment of the substrate before the film formation and the post-treatment using the same catalyst. It is also found that, for the case where the silicon nitride film is formed on the back surface, the results of Experiments 7 and 8 making use of the catalytic CVD process are desirable similarly to the results shown in Table 2, but Comparative Examples 5 and 6 making use of the plasma CVD cause degradation in the characteristics by forming the silicon nitride films on the back surface side. This is supposedly because the silicon nitride films in Comparative Examples exhibited the field passivation effect, and thereby the inversion layer on the substrate side grew larger, and the short-circuiting shown in FIG. 5 became more likely to occur.

What is claimed is:
1. A method of fabricating a solar cell which comprises cell, the method comprising:
   placing in a reaction vessel:
      a heat catalyst, and
      a semiconductor solar cell substrate having a light receiving surface formed on a first major surface of the semiconductor solar cell substrate;
   forming a light-receiving-surface-side insulating film to cover the light receiving surface by a catalytic CVD process, the catalytic CVD process comprising:
      supplying and contacting a film-forming gas with the heat catalyst to form by a chemical reaction an inorganic insulating material, the film-forming gas comprising:
         a silicon source gas, and
         a nitrogen source gas comprising an anionic source gas producing an anionic component capable of binding with silicon in an inorganic material to be obtained, at least one of the silicon source gas and the anion source gas having hydrogen atoms in a molecule;
      regulating a ratio of mixing the silicon source gas and the nitrogen source gas, so as to obtain silicon nitride having an Si/N atomic ratio of 0.80 to 1.80, both ends inclusive; and
      depositing the inorganic insulating material on the light receiving surface of the semiconductor solar cell substrate;
   wherein:
      the solar cell is configured to generate photovoltaic power when light is irradiated on the light receiving surface; and
      the light-receiving-surface-side insulating film is a low-hydrogen-content silicon nitride inorganic insulating film having:

a cationic component comprising at least 50% silicon; and a hydrogen content of less than 10 at %.

2. The method of fabricating a solar cell as claimed in claim 1, wherein the film-forming gas is supplied to the reaction vessel without being diluted with hydrogen.

3. A method of fabricating a solar cell, the method comprising:

placing in a reaction vessel:
a heat catalyst, and
a semiconductor solar cell substrate having:
a first major surface,
a second major surface, and
a light receiving surface formed on the first major surface;

forming a silicon nitride inorganic back-side insulating film on a second major surface by a catalytic CVD process, the catalytic CVD process comprising:
supplying and contacting a film-forming gas with the heat catalyst to form by a chemical reaction a silicon nitride inorganic insulating material, the film-forming as comprising:
a silicon source gas, and
a nitrogen source gas;
regulating a ratio of mixing the silicon source gas and the nitrogen source gas, so as to obtain silicon nitride having an Si/N atomic ratio of 0.80 to 1.80, both ends inclusive;
depositing the silicon nitride inorganic insulating material on the second major surface of the semiconductor solar cell substrate;
wherein:
a back electrode is provided so as to cover the back-side insulating film and to contact the second major surface of the semiconductor solar cell substrate through conductive portions penetrating the back-side insulating film; and
the solar cell is configured to generate photovoltaic power when light is irradiated on the light receiving surface.

4. The method of fabricating a solar cell as claimed in claim 3, wherein silane and ammonia are used as the silicon source gas and the nitrogen source gas, respectively.

5. The method of fabricating a solar cell as claimed in claim 1, further comprising:
surface-treating the light receiving surface before the inorganic insulating film is deposited by the catalytic CVD process by introducing a surface treatment gas into the reaction vessel, and supplying the surface treatment gas to the light receiving surface of the semiconductor solar cell substrate so as to effect a surface treatment, while making the film-forming gas come into contact with the heat catalyst.

6. The method of fabricating a solar cell as claimed in claim 5, wherein the semiconductor solar cell substrate is a silicon substrate, and the surface-treatment gas is ammonia gas.

7. The method of fabricating a solar cell as claimed in claim 1, further comprising post treating the light-receiving-surface-side insulating film by:
introducing a post-treatment gas into the reaction vessel, contacting the post-treatment gas with the heat catalyst, and
supplying the post-treatment gas to the surface of the insulating film.

8. The method of fabricating a solar cell as claimed in claim 1, the method further comprising:
forming a silicon nitride inorganic back-side insulating film on a second major surface of the semiconductor solar cell substrate by a catalytic CVD process, the catalytic CVD process comprising:
supplying and contacting a film-forming gas with the heat catalyst to form by a chemical reaction an inorganic insulating material, the film-forming gas comprising:
a silicon source gas, and
a nitrogen source gas comprising an anionic source gas producing an anionic component capable of binding with silicon in an inorganic material to be obtained, at least one of the silicon source gas and the anion source gas having hydrogen atoms in a molecule; and
depositing the inorganic insulating material on the second major surface of the semiconductor solar cell substrate; and
post treating the back-side insulating film by:
introducing a post-treatment gas into the reaction vessel, contacting the post-treatment gas with the heat catalyst, and
supplying the post-treatment gas to the surface of the insulating film; wherein:
a back electrode is provided so as to cover the back-side insulating film and to contact the second major surface of the semiconductor solar cell substrate through conductive portions penetrating the back-side insulating film.

9. The method of fabricating a solar cell as claimed in claim 8, wherein the semiconductor solar cell substrate is a silicon substrate, and the post-treatment gas is ammonia gas, hydrogen gas, or a mixture of ammonia gas and hydrogen gas.

10. The method of fabricating a solar cell as claimed in claim 3, further comprising:
surface-treating the second major surface before the back-side inorganic insulating film is deposited by the catalytic CVD process by introducing a surface treatment gas into the reaction vessel, and supplying the surface treatment gas to the second major surface of the semiconductor solar cell substrate so as to effect a surface treatment, while making the film-forming gas come into contact with the heat catalyst.

11. The method of fabricating a solar cell as claimed in claim 10, wherein the semiconductor solar cell substrate is a silicon substrate, and the surface-treatment gas is ammonia gas.

12. The method of fabricating a solar cell as claimed in claim 3, further comprising post-treating the back-side insulating film by:
introducing a post-treatment gas into the reaction vessel, contacting the post-treatment gas with the heat catalyst, and
supplying the post-treatment gas to a surface of the back-side insulating film.

13. The method of fabricating a solar cell as claimed in claim 7, wherein the semiconductor solar cell substrate is a silicon substrate, and the post-treatment gas is ammonia gas, hydrogen gas, or a mixture of ammonia gas and hydrogen gas.

14. The method of fabricating a solar cell as claimed in claim 12, wherein the semiconductor solar cell substrate is a silicon substrate, and the post-treatment gas is ammonia gas, hydrogen gas, or a mixture of ammonia gas and hydrogen gas.

* * * * *